(12) United States Patent
Keaveney et al.

(10) Patent No.: US 8,638,139 B2
(45) Date of Patent: Jan. 28, 2014

(54) PHASE LOCKED LOOP (PLL) BASED FREQUENCY SWEEP GENERATOR

(75) Inventors: Michael Keaveney, Lisnagry (IE); Patrick Walsh, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 159 days.

(21) Appl. No.: 13/229,449

(22) Filed: Sep. 9, 2011

(65) Prior Publication Data

US 2012/0062297 A1 Mar. 15, 2012

Related U.S. Application Data

(60) Provisional application No. 61/381,893, filed on Sep. 10, 2010.

(51) Int. Cl.
*H03L 7/06* (2006.01)
(52) U.S. Cl.
USPC .......................................... 327/156; 327/159
(58) Field of Classification Search
USPC ................................................... 327/156.159
See application file for complete search history.

(56) References Cited

U.S. PATENT DOCUMENTS

| 7,205,850 | B2 * | 4/2007 | Uozumi et al. ................. 331/23 |
| 7,317,360 | B2 | 1/2008 | Keaveney |
| 7,463,710 | B2 | 12/2008 | Walsh et al. |
| 7,499,689 | B2 * | 3/2009 | Uozumi et al. ............... 455/260 |
| 2007/0164828 | A1 * | 7/2007 | Uozumi et al. ................. 331/16 |
| 2011/0285575 | A1 * | 11/2011 | Landez et al. .................. 342/70 |
| 2011/0298506 | A1 * | 12/2011 | Salle et al. .................... 327/156 |
| 2012/0105114 | A1 * | 5/2012 | Yun et al. ...................... 327/156 |
| 2013/0093524 | A1 * | 4/2013 | Nakamura ...................... 331/34 |

* cited by examiner

*Primary Examiner* — Ryan Jager
(74) *Attorney, Agent, or Firm* — Knobbe Martens Olson & Bear LLP (57) ABSTRACT

A phase locked loop (PLL) based frequency sweep generator and methods for performing a frequency sweep are disclosed. In one implementation, the frequency sweep generator includes a circuit configured to generate a signal having a saw-tooth wave frequency ramp. The saw-tooth wave frequency ramp includes a rising portion and a resetting portion. The resetting portion has a shorter duration than the rising portion and includes a plurality of steps for decrementing the frequency of the signal.

25 Claims, 7 Drawing Sheets

ABSTRACT# PHASE LOCKED LOOP (PLL) BASED FREQUENCY SWEEP GENERATOR

CROSS REFERENCE TO RELATED APPLICATIONS

This application claims the priority benefit under 35 U.S.C. § 119 (e) of U.S. Provisional Patent Application No. 61/381,893, filed on Sep. 10, 2010, the disclosure of which is incorporated herein by reference in its entirety.

BACKGROUND

1. Field

Embodiments of the invention relate to electronic devices, and more particularly, in one or more embodiments, to a phase locked loop system.

2. Description of the Related Technology

Phase locked loops (PLL) are useful building blocks for electronic circuits. In a PLL, the output signal should be phase and frequency locked to an input reference signal. A PLL that has a frequency divider inserted in the feedback loop can be used as an integer-N frequency synthesizer. For an integer-N frequency synthesizer, the signal at the phase detector negative input is phase and frequency locked to the reference. At steady state, the output frequency and phase is N times the reference frequency and phase. Output frequencies can be synthesized in steps of the reference frequency by setting the value of N.

In an integer-N frequency synthesizer, at steady state, there should be exactly N periods of the output for every period of the reference. Therefore a rising edge of the output at a period N is in phase with a rising edge of the reference.

For finer adjustment of an output frequency and improved performance of a PLL, a fractional-N synthesizer may be used. In a fractional-N synthesizer, the divider in the feedback path has an integer part and a fractional part and the output frequency step resolution can be a fraction of the reference frequency. The output may be described according to equation 1.

$$F_{OUT}=(N+F/M)\times F_{REF} \quad \text{Eq. 1}$$

The fractional part may be generated with a digital interpolator. An output of the digital interpolator includes a sequence of integer values with an average value given by F/M, in which F is an input value and M is the modulus. The interpolator may be, for instance, a single accumulator with an overflow bit set as the output or may be a higher order sigma-delta modulator.

Varying the output frequency in a fractional-N synthesizer is useful in applications such as wireless systems (e.g., cellular phones) where two or more channels at the same frequency should have different phases to reduce interference. Applications of a fractional-N synthesizer with programmable output phase also include phased array radar systems where RF waves are transmitted at the same frequency but at different phases to form constructive and destructive interference (e.g., beam forming). Beam forming applications may also include focusing RF waves generated by broadcast stations, such as cellular phone base stations.

SUMMARY OF CERTAIN INVENTIVE ASPECTS

According to some embodiments, an apparatus is disclosed. The apparatus includes a phase locked loop circuit configured to generate an output signal having a frequency that is a fractional multiple of an input reference signal, the phase locked loop circuit comprising a frequency divider that is configured to generate a saw-tooth wave frequency ramp with an incrementing frequency during a rising period and a decrementing frequency during a resetting period according to a division value received by the frequency divider, and a division value generator coupled to the phase locked loop circuit and configured to generate the division values such that the division value increments during the rising period and decrements during the resetting period, wherein the rising period is longer than the resetting period.

According to some embodiments, a method of generating signals having a saw-tooth wave frequency ramp for a phase locked loop (PLL) system is disclosed. The saw-tooth wave frequency ramp may have rising periods and resetting periods. The method includes increasing the frequency of the signals during the rising periods according to a plurality of rising steps, and gradually decreasing the frequency of the signals during the resetting periods according to a plurality of falling steps, wherein the rising periods are longer than the resetting periods.

According to some embodiments, an apparatus for generating signals a saw-tooth wave frequency ramp for use in a phase locked loop (PLL) system is disclosed. The apparatus includes means for increasing the frequency of the signals during the rising period according to a plurality of rising steps, and means for decreasing the frequency of the signals during the resetting period according to a plurality of falling steps, wherein the rising period is greater than the resetting period.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate similar elements.

As discussed above, a PLL based frequency synthesizer (e.g., fractional-N frequency synthesizer) with an external voltage controlled oscillator (VCO), can be used to generate periodic frequency sweeps used for, for example, frequency modulation (FM) continuous wave (CW) radar systems. Sweeping the feedback divider value (both integer and fractional parts in a fractional-N PLL) versus time results in a corresponding frequency sweep being produced at the VCO output. The feedback divider value sweep can be generated internally in the frequency synthesizer based on control data received from a controller or programmed in the frequency synthesizer. The control data may include a start value, a divider step size, and a number of steps for the sweep. The control data is used by the frequency synthesizer to control the start frequency, frequency step size, and end frequency of the sweep produced at the VCO output.

Figure 1:
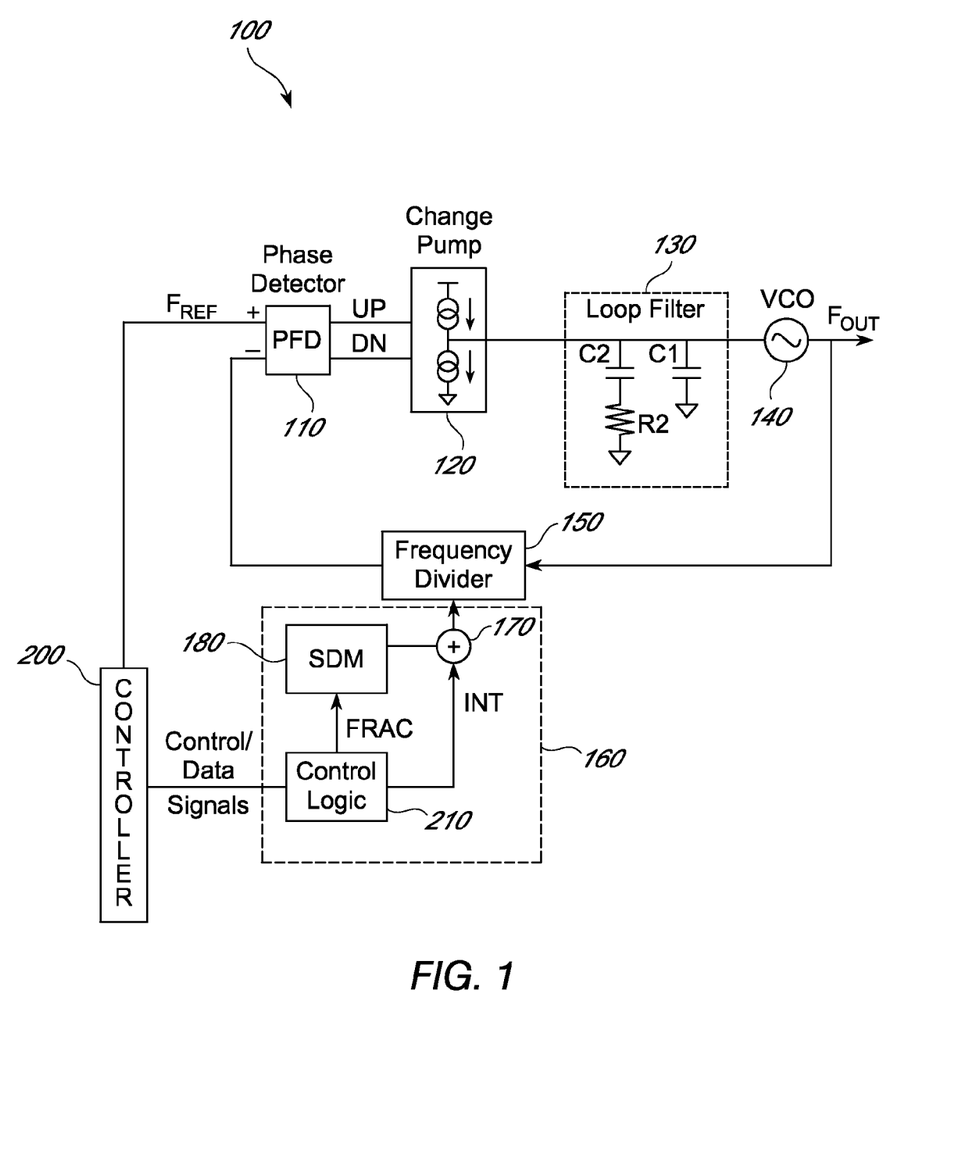
FIG. 1 is block diagram of a fractional-N phase locked loop (PLL) circuit.

FIG. 1 is block diagram of a fractional-N phase locked loop (PLL) circuit. The fractional-N synthesizer 100 includes a phase detector 110, a charge pump 120, a loop filter 130, a voltage controlled oscillator (VCO) 140, a frequency divider 150, a divide value generator 160, and a controller 200.

The phase detector 110 is configured to receive a reference signal $F_{REF}$ having a reference frequency at a positive input terminal and a feedback signal $F_{out}$ having an output frequency at a negative input terminal. The reference signal $F_{REF}$ may be received from a controller 200 coupled to the phase detector 110. While not illustrated, the reference signal $F_{REF}$ may be a function of a signal having a phase detector reference frequency and an input signal having an input reference frequency. The phase detector 110 compares the signals $F_{out}$ and $F_{REF}$ to adjust the phase of the output signal $F_{out}$ to match the phase of the reference signal $F_{REF}$. The output signal of the phase detector 110 is translated into one of two signal, UP and DN. The signals (UP or DN) control operation of the charge pump 120.

The output of the phase detector 110 is coupled to a charge pump 120 for control of voltage across a capacitor by the charge pump 120, such that the charge of the capacitor is proportional to the phase difference of the signals $F_{out}$ and $F_{REF}$. The output of the charge pump 120 is coupled to the VCO 140 through a loop filter 130 to generate a signal having an adjusted output signal frequency. The loop filter 130 is configured to integrate or average the signal received from the charge pump 120 and provide a control voltage to the VCO 140, thereby increasing or decreasing the frequency of the output signal $F_{out}$.

The frequency of the output signal $F_{out}$ generated by the VCO is sent through a feedback loop to the phase detector 110 through the frequency divider 150. The frequency divider 150 is configured to divide the output signal $F_{out}$ by a divisor generated by the divide value generator 160 and transfer the divided signal back to the negative input of the phase detector 110.

The divide value generator 160 may include an adder 170, a sigma-delta modulator 180, and control logic 210. In a fractional-N PLL, the frequency divider 150 is configured to receive a divider value that includes an integer part and a fractional part. For example, control logic 210 may be configured to receive control and data signals from the controller 200. The control and data signals may include data for generating an integer value INT and an integer value F for generating a fractional component FRAC. The integer value INT may be separate from or the same as the integer value F. The control and data signal may also include a modulus value M, a start time, an end time, an interrupt signal, or instructions for generating the same. For example, control logic 210 may receive or be configured to generate a modulus M, an integer value INT and an integer value F. Control logic 210 may generate a fractional input FRAC by dividing the integer value F by the modulus M. The fractional input FRAC is provided to a sigma-delta modulator 180.

The sigma-delta modulator 180 receives the fractional input FRAC and computes a sequence of integer values that have an average value equal to the fractional input FRAC. The sequence of integers are added to the integer value INT by an adder 170 to compute the value that is programmed into the frequency divider 150 for the next reference cycle. The frequency synthesizer 100 may be updated by programming a new value of F, INT, or M or by reprogramming of control logic 210 which may receive control data and control signals from external sources.

The various components of the frequency synthesizer 100 may be provided as separate or discrete elements. For example, the controller 200 may be provided separately from other components of the frequency synthesizer 100 and may be programmed to generate or provide various control and data signals for controlling the operation of the frequency synthesizer 100.

Figure 2:
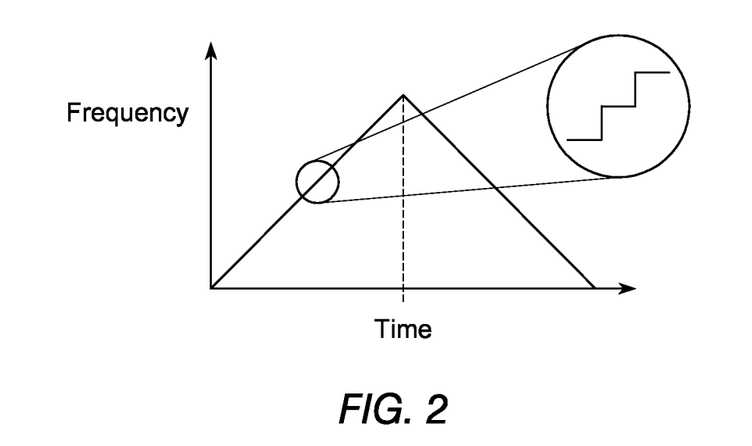
FIG. 2 illustrates an example of a triangle wave frequency ramp.
Figure 3:
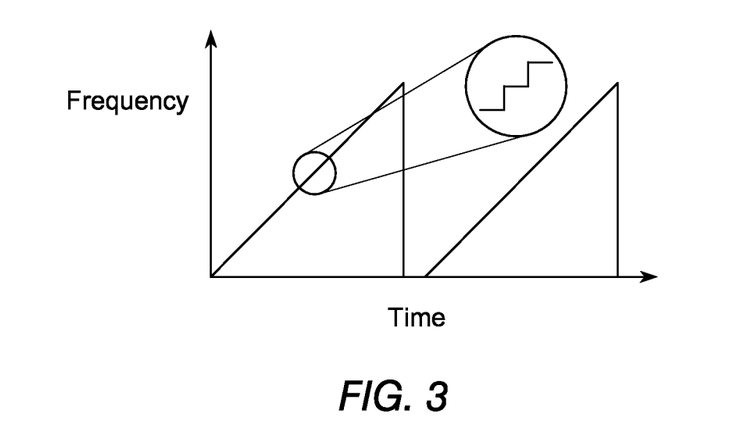
FIG. 3 illustrates an example of a saw-tooth wave frequency ramp.

The frequency synthesizer 100 as described above can be configured to generate various shaped ramp sweeps, including triangle waveform ramps (also referred to as 2-way ramps), and saw-tooth wave shaped ramps (also referred to as one-way sweeps). FIG. 2 illustrates an example of a triangle wave frequency ramp, and FIG. 3 illustrates an example of a saw-tooth wave frequency ramp. The ramp of FIG. 2, as illustrated, may include a series of rising steps for gradually increasing the frequency signal from a start frequency to an end frequency, and a series of falling steps for gradually decreasing the frequency signal from the end frequency back to the start frequency. The rising period of the triangle wave frequency ramp can be equal to the falling period of the ramp. Each half of the triangle wave frequency ramp may have a duration on the order of milliseconds, for example, each half of the triangle wave frequency ramp may be equal to about 3 ms. Other periods can be used and will be readily determined by one of ordinary skill in the art.

The saw-tooth wave frequency ramp illustrated in FIG. 3 may also include a series of rising steps for increasing the frequency of the signal during a rising period and a reset period for resetting the frequency of the signal from the end frequency to the start frequency directly. The rising period of the saw-tooth wave frequency ramp may have a duration on the order of microseconds. For example, the rising period may be equal to about 20 μs. Other periods can be used and will be readily determined by one of ordinary skill in the art.

The triangle and/or the saw-tooth wave frequency ramp can have a positive or negative slope. The ramps of FIG. 2 and FIG. 3 are illustrated as having a positive slope.

Slow Ramp Frequency Modulated Continuous Wave (FMCW) radar systems may use triangle waveform ramps with the same magnitude positive and negative slopes to calibrate and adjust for the effects of Doppler shift in the system. Saw-tooth shaped ramps may be used in Fast Ramp FMCW systems where the frequency ramp slope is sufficiently high that the frequency change seen due to Doppler shift is relatively small and thus can usually be ignored.

Figure 4:
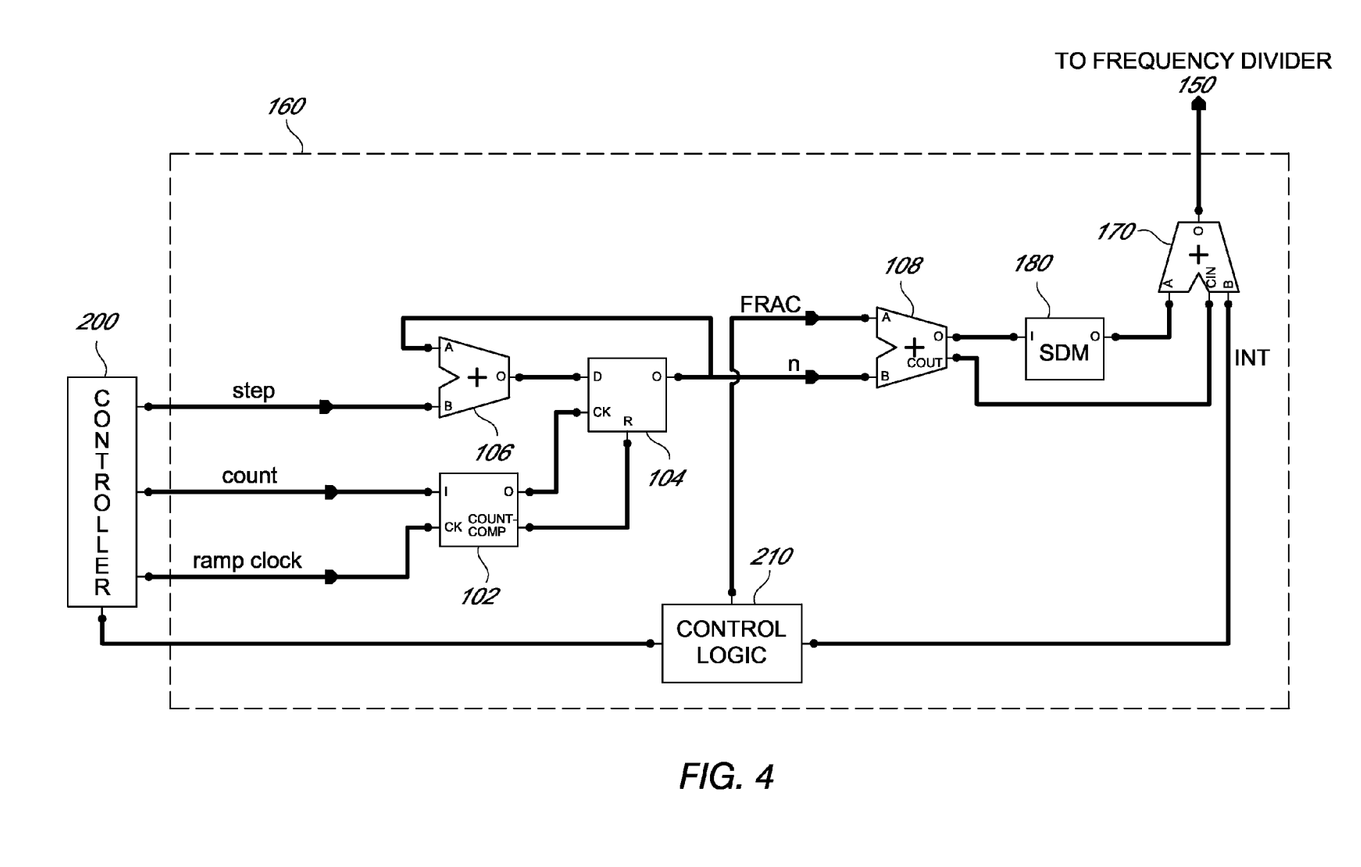
FIG. 4 is a block diagram of a circuit for use in a PLL circuit for generating a frequency ramp signal.

FIG. 4 illustrates is a block diagram of a circuit for use in a PLL circuit for generating a frequency ramp signal. The circuit of FIG. 4 includes a representation of one embodiment of the divide value generator 160 in communication with the controller 200. The divide value generator 160 as illustrated in FIG. 4 may be implemented in a frequency synthesizer 100 for generating a saw-tooth wave frequency ramp.

As illustrated in FIG. 4, the divide value generator 160 includes a counter 102 configured to receive a count signal and a ramp clock signal from a controller 200. The counter 102 generates an output, which is provided as an input to the clock input of a register 104. The counter 102 also generates a count completion signal, which is provided as an input to a reset input of the register 104. The register 104 outputs a data word n for use in generating the frequency ramp. The data word n may, for example, be a 25-bit word, but is not limited thereto. Alternatively, the register 104 may be a flip-flop circuit.

The data word n is fed back to an input A of an adder 106. The adder 106 also receives a step signal at an input B, and is configured to add the data word n to the step signal to generate an output which is connected to an input of the register 104. The value of the data word n is incremented according to the ramp clock rate by a value corresponding to the step signal for a number of clock cycles C. The number of clock cycles C corresponds to the number of steps in the frequency ramp and may be programmed in the counter 102. When the count value determined by the counter 102 reaches a number of clock cycles C, the counter 102 is configured to generate a count completion signal (count comp), which is provided to the reset input of the register 104. After C clock cycles, a reset pulse is generated, which resets the value of n back to zero for the start of the next ramp period As described above with reference to FIG. 1, control logic 210 may be configured to generate an integer value INT and a fractional value FRAC as outputs based on control and data signals received from the controller 200. The frequency ramp is generated by adding the data word n to the FRAC word at adder 108. The output of the adder 108 is connected to the sigma-delta modulator 180, which is configured to generate an average value corresponding to the received value n+FRAC, and the average value is provided as an input to the adder 170. Adder 170 is configured to add the output of the sigma-delta modulator 180 to the integer value INT to generate the divider value, which is sent to the frequency divider 150. A carry out, if any, from the adder 108 is carried up into the adder 170 as shown in FIG. 4 to ensure frequency transitions across integer boundaries of the divider value.

Figure 5:
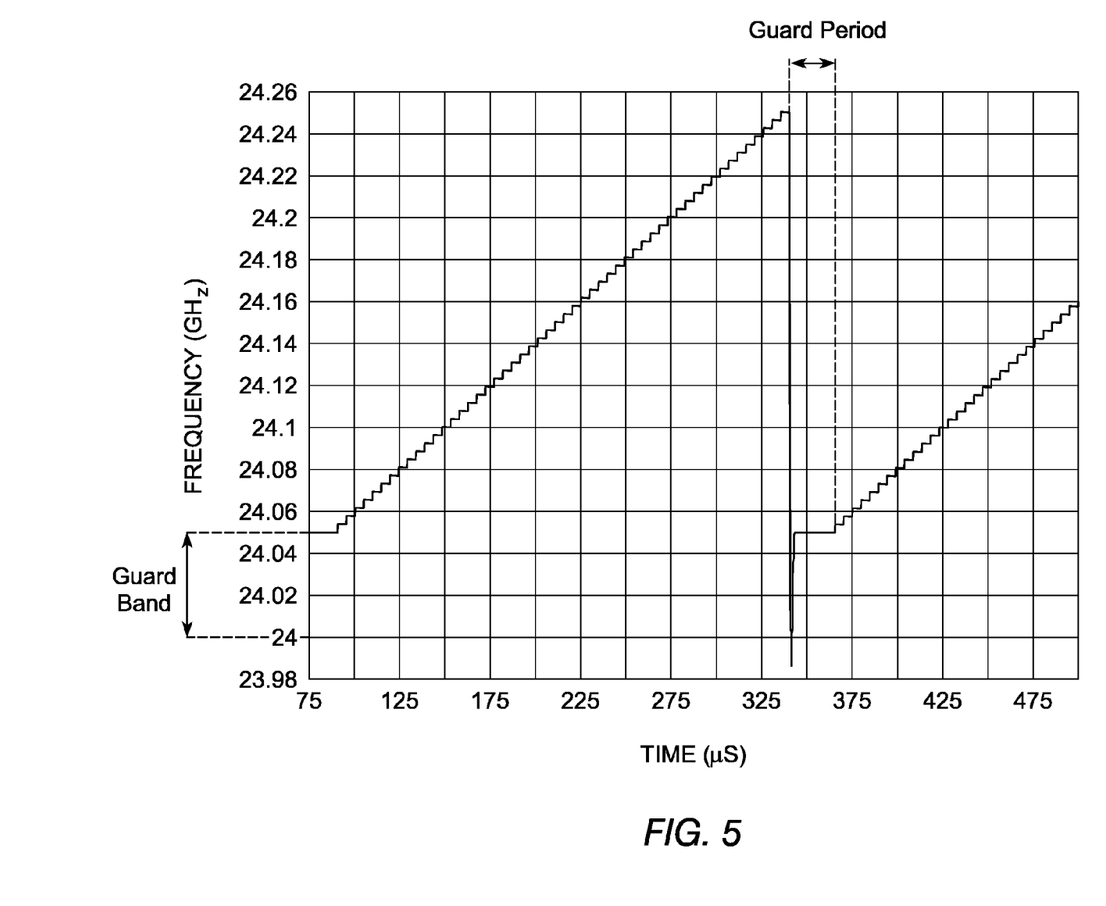
FIG. 5 illustrates an example of a saw-tooth wave frequency ramp generated by the circuit of FIG. 4.

FIG. 5 illustrates an example of a saw tooth wave frequency ramp generated by the circuit of FIG. 4. The ramp is an example of the transmit frequency versus time of a Fast Ramp FMCW radar transmitter operating in the 24 GHz industrial, scientific, and medical (ISM) band. Since frequency waveforms are generated inside a PLL with a finite loop bandwidth, the waveforms are subject to frequency settling dynamics of the PLL. The loop bandwidth is usually selected to provide a compromise between fast output frequency settling and low output phase noise and spurious signals. The saw-tooth wave frequency ramp of FIG. 5, may also be configured to include a guard period or delay between ramps to allow time for the frequency to settle following a large step from an end frequency of each ramp cycle and back to the start frequency.

In a PLL configured to generate a saw-tooth frequency sweep, a frequency settling transient overshoots before settling to its final value. The amount of overshoot is proportional to the frequency step size for a given damping factor. The overshoot in the PLL output frequency is particularly acute with saw-tooth ramp generation when the PLL makes the relatively large jump from the end frequency back to the start frequency.

The overshoot of a saw-tooth waveform can be seen in the example shown in FIG. 5. The ramp of FIG. 5 may correspond to a frequency ramp generated for a target frequency ramp having a frequency which increases linearly between 24.05 GHz and 25.25 GHz in a saw-tooth waveform. An example of a design requirement of the target frequency ramp may be that the frequency does not drop below 24 GHz in order to avoid interference with other frequency bands, and violation of spurious signal emission limits for the adjacent band.

As can be seen in this example, even with a 0.05 GHz guard-band between the lower programmed frequency and 24 GHz, the frequency overshoot still causes the VCO frequency to drop below 24 GHz for a short time interval. Hence, a large guard-band to the lower frequency limit may be used for a radar transmitter or other device to maintain compliance.

It may be desirable for a frequency ramp to cover as wide a frequency span as possible for relatively good time and position resolution in a device, such as a radar system, such that a reduced guard-band results in better performance. While the amount of overshoot can be reduced by increasing the loop damping factor, an increased loop damping factor may lead to other undesirable effects, such as the generation of long settling tails which could result in the output frequency not settling back to the start value in time for the start of the next ramp cycle.

Saw-Tooth Wave Frequency Ramp Generator with Low Overshoot

Figure 6:
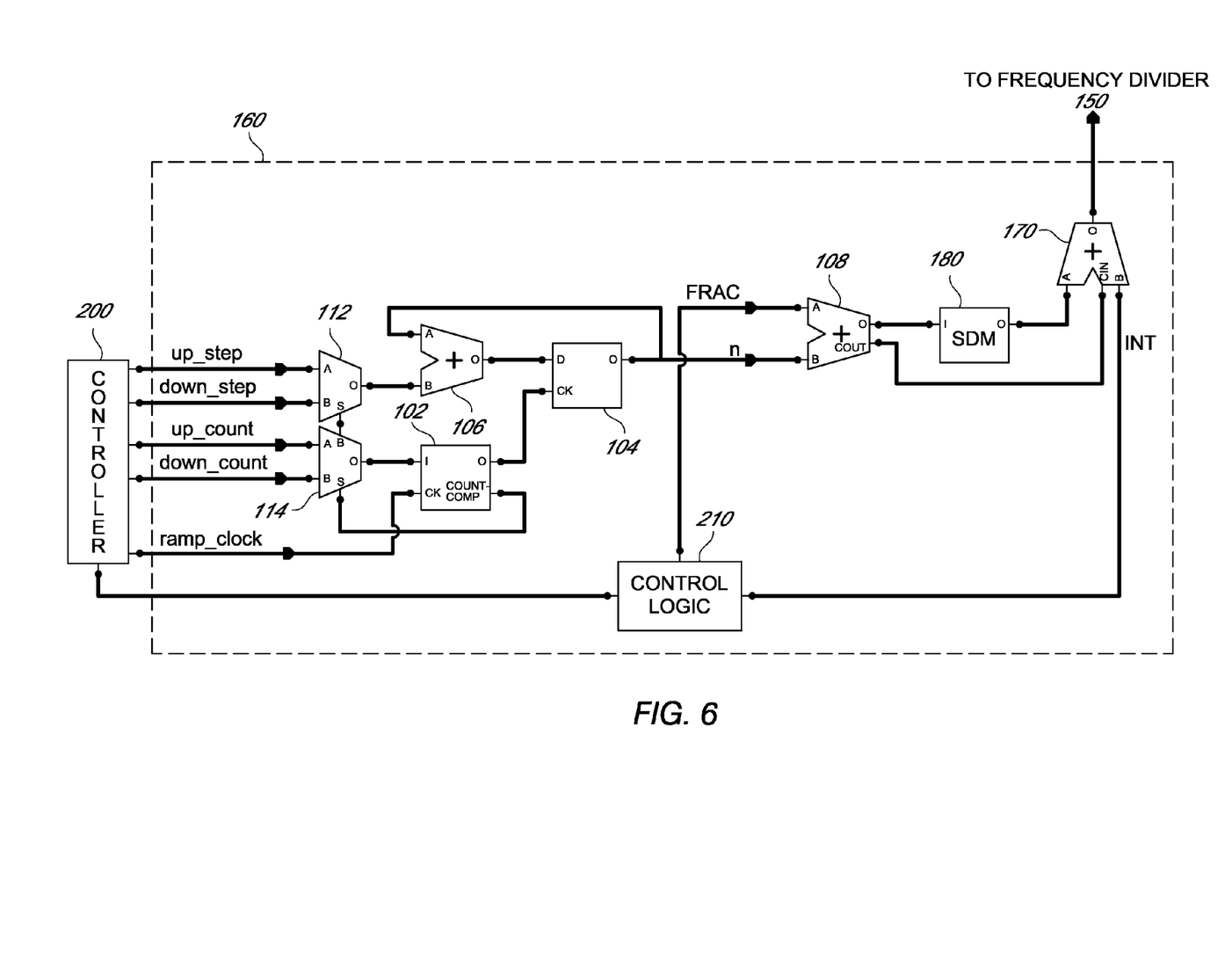
FIG. 6 is a block diagram of a circuit for use in a PLL circuit for generating a frequency ramp according to some embodiments.

FIG. 6 illustrates a block diagram of a circuit for use in a PLL circuit for generating a frequency ramp according to some embodiments. The circuit of FIG. 6 includes a representation of one embodiment of the divide value generator 160 in communication with the controller 200. The divide value generator 160 as illustrated in FIG. 6 may be implemented in a frequency synthesizer 100 for generating a saw-tooth wave frequency ramp.

The operation of the controller 200, the control logic 210, the adder 108, the sigma-delta modulator 180, and the adder 170 can be as described earlier in connection with FIG. 4.

The divide value generator 160 of FIG. 6 includes a first multiplexer 112 configured to receive an up_step signal and a down_step signal at its inputs A, B. The divide value generator 160 also includes a second multiplexer 114 configured to receive an up_count signal and a down_count signal at its inputs A, B. A select input of the first multiplexer 112 and the second multiplexer 114 is coupled to the count completion signal output (count_comp) of the counter 102. The operation of the adder 106, register 104, and counter 102 is similar to that described with reference to FIG. 4 above.

The first multiplexer 112 provides an output signal to the input B of the adder 106. The second multiplexer 114 provides an output signal to the input I of the counter 102. Although elements 112 and 114 are described and illustrated as multiplexers, one having ordinary skill in the art will recognize that the first multiplexer 112 and the second multiplexer 114 may be implemented by any form of selection circuit or module configured to output a signal selected from a plurality of inputs, such as by three-state logic. Therefore, the first multiplexer 112 and the second multiplexer 114 may generally be referred to as selection units.

The adder 106 receives an output signal from the register 104 corresponding to data word n at the first input A, and provides a sum signal to the input D of the register 104. The counter 102 receives the output signal from the second multiplexer 114 and the ramp_clock signal at the clock input ck, and generates an output signal corresponding to a count value as an input to the clock input of the register 104. The counter 102 also activates the count_comp signal after detecting that the number of clock cycles has reached a predetermined number (e.g. C), and provides the count_comp signal to the first multiplexer 112 and the second multiplexer 114 such that the multiplexers 112 and 114 change selection of input signals.

Figure 7:
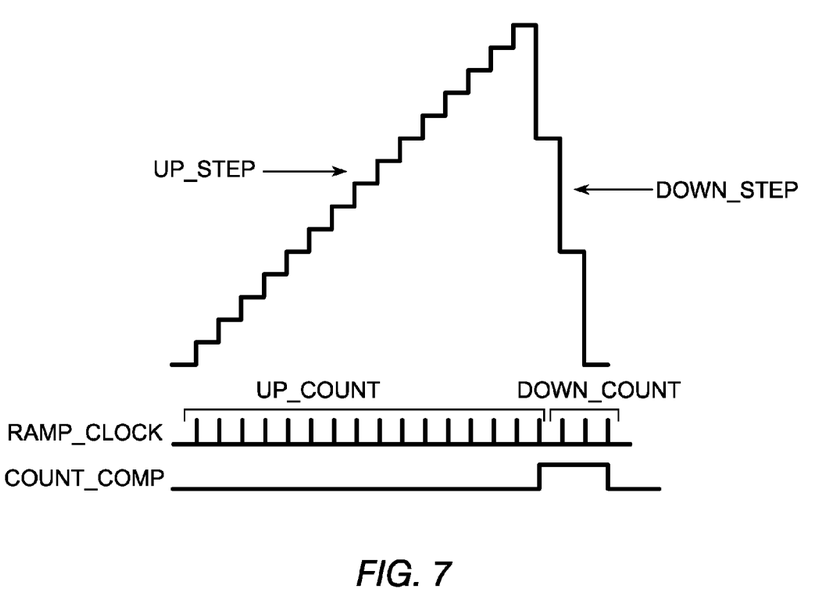
FIG. 7 illustrates a timing diagram of a saw-tooth wave frequency ramp according to some embodiments.

Unlike the circuit described with reference to FIG. 4 above, rather than resetting the value of the data word n, when the counter 102 determines that the count has reached the value C, the count_comp signal is provided to the first multiplexer 112 and the second multiplexer 114 to toggle the selection at the input of the multiplexers. As a result, the data word n is decremented from an end value to 0 by a series of steps, and in turn, the frequency ramp is decremented from the end frequency to the start frequency by a series of falling steps. This operation will be further described with reference to FIG. 7. FIG. 7 illustrates a timing diagram of a saw-tooth wave frequency ramp according to some embodiments. As illustrated in FIG. 7, the frequency of the signal is incremented for a time period corresponding to up_count by increments corresponding to up_step. When the value of the counter 102 corresponds to the value of up count, the signal count_comp is generated. In response, the frequency is decremented during a reset period by a number of steps corresponding to the signal down_count and increments corresponding to the signal down_step.

As a result, rather than resetting the ramp directly to the start value, the frequency ramp is decremented for a number of falling steps corresponding to a down_count and according to the down_step signal. If the value of up_count×up_step is equal to down_count×down_step, then n will have decremented back to zero after down_count ramp clock cycles prior to the start of the next ramp period, and the resulting frequency ramp signal will be reset back to the start frequency.

Figure 8:
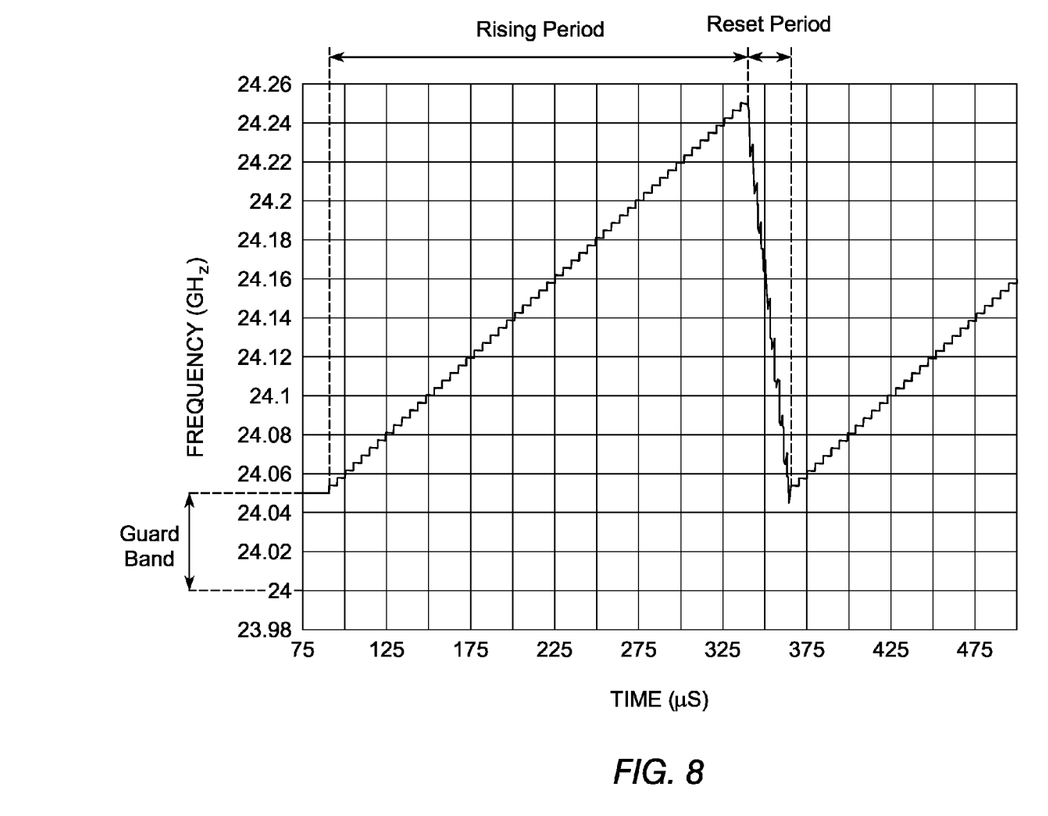
FIG. 8 illustrates an example of a saw tooth wave frequency ramp according to some embodiments.

FIG. 8 illustrates a saw-tooth wave frequency ramp according to some embodiments. As illustrated in the graph of FIG. 8, a reset period between the end frequency and start frequency of the next ramp is utilized to break the frequency step from the end frequency to the start frequency into a number of smaller steps. As a result, the frequency transient back to the start frequency is smaller and thus will have a correspondingly smaller overshoot when implemented in a PLL than the ramp illustrated in FIG. 5.

As illustrated in FIG. 8, the saw-tooth ramp waveform includes a rising period and a reset period. The reset period corresponds to the time interval during which the frequency of the signal is decremented to the start value. According to some embodiments, the reset period may be about 20% or less than the rising period. For example, as illustrated in FIG. 8, the reset period may be about 10% of the rising period. According to some embodiments, the time designated for the reset period may be less than or substantially equal to the time of the guard period of FIG. 5.

Thus, the frequency transition of FIG. 8 can exhibit substantially no overshoot, unlike the ramp illustrated in FIG. 5. In the context of the ramps illustrated in FIGS. 5 and 8, the term "overshoot" can refer to a frequency deviation of a saw-tooth wave frequency ramp, in which the end frequency of the ramp is lower than the start frequency thereof. The overshoot may be defined as a deviation in percentage with respect to the start frequency (e.g., deviation/start frequency× 100), for example, greater than about 0.1%, or optionally about 0.05%. The overshoot may also be defined with respect to an absolute value, for example, a deviation which is greater than about 50 MHz, or optionally 10 MHz from the start frequency. A person/one having ordinary skill will appreciate that the amount of the deviation can differ from the above example ranges, depending on the system.

In some embodiments described above, the frequency transition of a ramp has substantially no overshoot, e.g., the transition is from the end frequency to the start frequency is completed with a deviation of less than 0.1% (or optionally about 0.05%) with respect to the start frequency, or less than 50 MHz (or optionally about 10 MHz) from the start frequency. As a result, the guard band of the system may be reduced or substantially eliminated, thereby improving performance of the frequency sweep system.

The transition from the end frequency back to the start frequency does not necessarily have to performed in equal steps as shown in the above described embodiments. For example, the value of down_count may correspond to any number of clock periods that is less than the value of up_count. As a result, the number of falling steps may be set to any value less than the number of rising steps. For example, if the number of rising steps is given as $N_{RS}$, the number of falling steps may be set to $N_{FS}$ which is less than $N_{RS}$.

Further, the value of up_step may be less than or equal to the value of down_step such that the step size of the falling steps is greater than the step size of the rising steps. In some embodiments, the step size of the falling steps may be variable as the frequency is decremented. For example, a first falling step from an end frequency to a next frequency may be greater than the next falling step. In some embodiments, the falling steps may be reduced in size in a binary fashion. For example, a first falling step may have a step size $FS_1$, a second falling step may have a step size $FS_2 = FS_1/2$, a third falling step may have a step size $FS_3 = FS_2/2 = FS_1/4$, etc. The first step size $FS_1$ may be set to reduce the frequency from the end frequency in the ramp to a frequency that is at a midpoint of the end frequency and the start frequency. A variable step size for the falling steps may be implemented by varying the value of down_step received from controller 200, or by including an arithmetic unit (e.g. a binary divider) prior to the input B of the first multiplexer 112. The arithmetic unit may also be configured to receive the data word n and reduce the data word n to a binary value, then divide the data word n by 2 to generate the down_step signal. For example, for a data word having a non-binary value of D, the arithmetic unit may reduce the data word from the non-binary value D to a binary value B and generate a first down_step signal to reduce the data word to a value B/2. The next down_step signal may be generated to reduce the data word to a value of B/4, etc.

The relationship of the falling steps may be characterized by any number of different functions (e.g. quadratic, exponential, etc.) such that the step size decreases as the frequency is decremented to the start value. In order to maintain substantially no overshoot, the last frequency step may be set such that the variation in frequency is sufficiently small from the previous frequency value to the start frequency. As a result, the small last frequency step may avoid an overshoot in the output frequency settling transient.

While the device of FIG. 6 was provided to illustrate an embodiment for generating the saw-tooth wave frequency ramp as shown in FIG. 8, a skilled artisan will appreciate that the same or similar ramp can be generated by any suitable circuits different from that shown in FIG. 6.

Applications

A skilled artisan will appreciate that the configurations and principles of the embodiments can be adapted for any other circuits. The circuits employing the above described configurations can be implemented into various electronic devices or integrated circuits. Examples of the electronic devices can include, but are not limited to, consumer electronic products, parts of the consumer electronic products, electronic test equipments, etc. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of certain embodiments is not intended to be exhaustive or to limit the inventions to the precise form disclosed above. While specific embodiments of, and examples for, the inventions are described above for illustrative purposes, various equivalent modifications are possible within the scope of the invention, as those skilled in the relevant art will recognize.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, cores, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein and in connection with FIGS. 1, 4, and 6 may be implemented within or performed by an integrated circuit (IC). The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. The logical blocks, modules, and circuits may include antennas and/or transceivers to communicate with various components within a network or within the device. A general purpose processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. The functionality of the modules or cores may be implemented in some other manner as taught herein. Furthermore, the functionality described herein (e.g., with regard to one or more of the accompanying figures) may correspond in some aspects to similarly designated "means for" functionality in the appended claims.

The functions described may be implemented in hardware, software, firmware, or any combination thereof. If implemented in software, the functions may be stored on or transmitted over as one or more instructions or code on a tangible, non-transitory computer-readable medium. Computer-readable media includes both computer storage media and communication media including any medium that facilitates transfer of a computer program from one place to another. A storage media may be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. A computer-readable medium may be in the form of a non-transitory or transitory computer-readable medium. Also, any connection may be properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media. In summary, it should be appreciated that a computer-readable medium may be implemented in any suitable computer-program product.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
    a phase locked loop circuit configured to generate an output signal having a frequency that is a fractional multiple of an input reference signal, the phase locked loop circuit comprising a frequency divider that is configured to generate a saw-tooth wave frequency ramp with an incrementing frequency during a rising period and a decrementing frequency during a resetting period according to a division value received by the frequency divider; and
    a division value generator coupled to the phase locked loop circuit and configured to generate the division values such that the division value increments during the rising period and decrements during the resetting period, wherein the rising period is longer than the resetting period
    wherein the division value generator is configured to generate incrementing division values according to a plurality of rising steps from a start value to an end value, followed by a plurality of falling steps from the end value to the start value,
    wherein the plurality of falling steps have a step size, and wherein the step size of at least a portion of the plurality of falling steps is varied.

2. The apparatus of claim 1, wherein the phase locked loop circuit is configured to generate a signal having incrementing frequency according to a plurality of rising steps from a start frequency to an end frequency, and wherein the phase locked loop circuit is configured to generate a signal having a decrementing frequency according to a plurality of falling steps from the end frequency to the start frequency.

3. The apparatus of claim 2, wherein a frequency step size of at least one of the plurality of falling steps is larger than a frequency step size of at least one of the plurality of rising steps.

4. The apparatus of claim 2, wherein the plurality of rising steps have a first frequency step size, and wherein the plurality of falling steps have a second frequency step size that is greater than the first frequency step size.

5. The apparatus of claim 1, wherein a step size of at least one of the plurality of falling steps is larger than a step size of at least one of the plurality of rising steps.

6. The apparatus of claim 1, wherein the plurality of falling steps comprise a first step having a first step size and a second step having a second step size, wherein the first step size has a value equal to one half of the difference between the end value and the start value, and wherein the second step size is equal to one half of the first step size.

7. The apparatus of claim 6, wherein the plurality of falling steps comprise a third step having a third step size, and wherein the third step size has a value equal to one half of the second step size.

8. The apparatus of claim 1, wherein the plurality of falling steps comprise a first step having a first step size, and a second step having a second step size, and a third step having a third step size, wherein the second step size has a value equal to one half of the difference between the value after the first step and the start value, and wherein the third step size is equal to one half of the second step size.

9. An apparatus comprising:
    a phase locked loop circuit configured to generate an output signal having a frequency that is a fractional multiple of an input reference signal, the phase locked loop circuit comprising a frequency divider that is configured to generate a saw-tooth wave frequency ramp with an incrementing frequency during a rising period and a decrementing frequency during a resetting period according to a division value received by the frequency divider; and
    a division value generator coupled to the phase locked loop circuit and configured to generate the division values such that the division value increments during the rising period and decrements during the resetting period, wherein the rising period is longer than the resetting period,
    wherein the phase locked loop circuit is configured to generate a signal having incrementing frequency according to a plurality of rising steps from a start frequency to an end frequency, and wherein the phase locked loop circuit is configured to generate a signal having a decrementing frequency according to a plurality of falling steps from the end frequency to the start frequency,
    wherein the plurality of falling steps have a frequency step size, and wherein the frequency step size of at least a portion of the plurality of falling steps is varied.

10. The apparatus of claim 9, wherein the plurality of falling steps comprise a first step having a first step size and a second step having a second step size, wherein the first step size has a value equal to one half of the difference between the end frequency and the start frequency, and wherein the second step size is equal to one half of the first step size.

11. The apparatus of claim 10, wherein the plurality of falling steps comprise a third step having a third step size, and wherein the third step size has a value equal to one half of the second step size.

12. The apparatus of claim 9, wherein the plurality of falling steps comprise a first step having a first step size, a second step having a second step size, and a third step having a third step size, wherein the second step size has a value equal to one half of the difference between the value after the first step and the start value, and wherein the third step size is equal to one half of the second step size.

13. An apparatus comprising:
    a phase locked loop circuit configured to generate an output signal having a frequency that is a fractional multiple of an input reference signal, the phase locked loop circuit comprising a frequency divider that is configured to generate a saw-tooth wave frequency ramp with an incrementing frequency during a rising period and a decrementing frequency during a resetting period according to a division value received by the frequency divider; and a division value generator coupled to the phase locked loop circuit and configured to generate the division values such that the division value increments during the rising period and decrements during the resetting period, wherein the rising period is longer than the resetting period, wherein the phase locked loop circuit is configured to generate a signal having incrementing frequency according to a plurality of rising steps from a start frequency to an end frequency, and wherein the phase locked loop circuit is configured to generate a signal having a decrementing frequency according to a plurality of falling steps from the end frequency to the start frequency, wherein the plurality of rising steps have a first step size, and wherein the plurality of falling steps have a second step size that is greater than the first step size.

14. An apparatus comprising:

a phase locked loop circuit configured to generate an output signal having a frequency that is a fractional multiple of an input reference signal, the phase locked loop circuit comprising a frequency divider that is configured to generate a saw-tooth wave frequency ramp with an incrementing frequency during a rising period and a decrementing frequency during a resetting period according to a division value received by the frequency divider; and a division value generator coupled to the phase locked loop circuit and configured to generate the division values such that the division value increments during the rising period and decrements during the resetting period, wherein the rising period is longer than the resetting period, wherein the division value generator comprises:

a control logic module configured to generate a fractional value and an integer value;

a register configured to output a data word;

a first adder configured to receive the fractional value and the data word and generate a first sum signal;

a sigma-delta generator configured to receive the first sum signal and generate an average value based on the first sum signal; and a second adder configured to receive the average value and the integer value and output the frequency division value as the sum of the average value and the integer value.

15. The apparatus of claim 14, wherein the division value generator further comprises:

a first selection unit having a first selection input and configured to select from an up_step signal and a down_step signal to output a first selected signal based on the first selection input;

a second selection unit having a second selection input and configured to select from an up_count signal and a down_count signal to output a second selected signal based on the second selection input;

a third adder configured to receive the first selected signal from the first selection unit and the data word and to output a first sum signal; and a counter configured to receive the second selected signal from the second selection unit and a ramp clock signal, the counter being configured to generate a count value output and a count completion signal, the count completion signal being provided to the first selection input of the first selection unit and the second selection input of the second selection unit, wherein the register is configured to receive the count value output and the first sum signal to generate the data word.

16. The apparatus of claim 14, wherein the counter is configured determine that a predetermined number of ramp clock signal cycles has been reached and output the count completion signal in response to the determination.

17. The apparatus of claim 14, wherein the register comprises a flip-flop circuit.

18. The apparatus of claim 14, wherein the division value generator further comprises an arithmetic unit configured to receive the data word and generate the down_step signal having a value equal to one half of the value of the received data word.

19. The apparatus of claim 18, wherein the arithmetic unit is configured to reduce the data word to a binary value.

20. A method of generating signals having a saw-tooth wave frequency ramp in a phase locked loop (PLL) system, the saw-tooth wave frequency ramp having rising periods and resetting periods, the method comprising:

increasing the frequency of the signals during the rising periods according to a plurality of rising steps;

gradually decreasing the frequency of the signals during the resetting periods according to a plurality of falling steps, wherein the rising periods are longer than the resetting periods; and generating signals having incrementing frequency according to a plurality of rising steps from a start frequency to an end frequency; and generating signals having a decrementing frequency according to a plurality of falling steps from the end frequency to the start frequency, wherein the plurality of falling steps have a frequency step size, and wherein the frequency step size of each of the plurality of falling steps is varied.

21. The method of claim 20, further comprising generating a signal having a plurality of saw-tooth wave frequency ramp cycles, wherein each cycle includes a rising period and a resetting period in sequence.

22. The method of claim 20, wherein the saw-tooth wave frequency ramp has substantially no overshoot.

23. The method of claim 20, wherein the resetting period is less than about 20% of the rising period.

24. The method of claim 20, wherein the plurality of falling steps include a first step having a first step size and a second step having a second step size, wherein the first step size has a value equal to one half of the difference between the end frequency and the start frequency, and wherein the second step size is equal to one half of the first step size.

25. The method of claim 24, wherein the plurality of falling steps include a third step having a third step size, and wherein the third step size has a value equal to one half of the second step size.

* * * * *